United States Patent [19]

Kawabata et al.

[11] Patent Number: 4,965,644

[45] Date of Patent: Oct. 23, 1990

[54] PURE GREEN LIGHT EMITTING DIODES AND METHOD OF MANUFACTURING THE SAME

[75] Inventors: Toshiharu Kawabata, Kyoto; Susumu Koike, Kawachinagano; Toshio Matsuda, Otsu; Hitoo Iwasa, Ibaraki, all of Japan

[73] Assignee: Matsushita Electric Industrial Co., Ltd., Osaka, Japan

[21] Appl. No.: 797,756

[22] Filed: Nov. 12, 1985

Related U.S. Application Data

[63] Continuation of Ser. No. 516,443, Jul. 22, 1983, abandoned.

[30] Foreign Application Priority Data

Jul. 28, 1982 [JP]  Japan .................................. 57-132735

[51] Int. Cl.[5] ............................................. H01L 33/00
[52] U.S. Cl. ....................................................... 357/17
[58] Field of Search .............................. 357/17, 63, 30

[56] References Cited

U.S. PATENT DOCUMENTS

| | | | |
|---|---|---|---|
| 3,870,575 | 3/1975 | Dosen .................................. | 357/17 |
| 3,931,631 | 1/1976 | Groves et al. ......................... | 357/17 |
| 4,001,056 | 1/1977 | Groves et al. ......................... | 357/17 |
| 4,101,920 | 7/1978 | Nagasawa et al. .................... | 357/17 |
| 4,228,455 | 10/1980 | Yasuda et al. ....................... | 357/17 |
| 4,417,262 | 11/1983 | Iwamoto et al. ..................... | 357/17 |

OTHER PUBLICATIONS

Japanese magazine "Electronics Parts and Materials", Feb. 1980, pp. 73–77, Pure Green (555 nm) LED written by Kaoru Takahashi (English translation of pp. 73 to 75 being also attached herewith.).

J. Appl. Phys., 53(5), May 1982, pp. 2878–3883 "Photocapacitance Study of Deep Levels Due to Nonstoichiometry in Nitrogen Free CAP Light-Emitting Diodes".

Proceedings of the 9th Conference on Solid State Devices, Tokyo 1977, pp. 87–92, "Effects of Vapor Pressure on GaP LED's".

Nishizawa, Jun-ichi, et al., "Effects of Vapor Pressure on GaP LED's", Proceedings of the 9th Conference on Solid State Devices, Tokyo, 1977; *Japanese Journal of Applied Physics*, vol. 17, (1988), Supplement 17-1, pp. 87-92.

J. Nishizawa, et al., "Photocapacitance Study of Deep Levels Due to Nonstoichiometry in Nitrogen-free GaP Light-Emitting Diodes," *Journal of Applied Physics*, 53(5), May 1982.

*Primary Examiner*—William L. Sikes
*Assistant Examiner*—Robert E. Wise
*Attorney, Agent, or Firm*—Stevens, Davis, Miller & Mosher

[57] ABSTRACT

Pure-green light emitting diodes include an n-type GaP layer formed on an n-type GaP substrate and a p-type GaP layer formed by using a liquid phase epitaxial method, the average donor concentration of the p-type GaP layer being less than or equal to $5 \times 10^{16}$ cm$^{-3}$. Liquid phase crystal growth of the above p-type GaP layer is realized by applying a method of keeping the melt used for the liquid phase crystal growth of the n-type GaP layer at a constant temperature and the ambient atmosphere at a reduced pressure for a prescribed period of time thereby to volatilize donor impurities from the melt and to compensate the donor impurities. Pure-green light emitting diodes easily distinguishable from yellow-green and having high brightness can be manufactured by applying the over-compensation method which is suitable for mass production.

5 Claims, 4 Drawing Sheets

PURE GREEN LIGHT EMITTING DIODES AND METHOD OF MANUFACTURING THE SAME

This application is a continuation of application Ser. No. 516,443, filed July 22, 1983 now abandoned.

This invention relates to pure green light emitting diodes with high brightness which emit pure-green light clearly distinguishable from yellow-green light, and a method of manufacturing the same.

Visible light emitting diodes (LED's) are now being widely used as display devices. Of them, gallium phosphide (GaP) LED's can emit light with either of three kinds of color—red, yellow-green and pure green—by using a GaP substrate as a starting material. These LED's are widely used because of good characteristics and low cost. However, the pure green GaP LED's have lower brightness and inferior hue as compared with those of red and yellow-green GaP LED's. It is important to improve the above-mentioned characteristics in order to use GaP LED's as display devices.

The peak emission wavelength of GaP pure-green LED's is about 555 nm. The conventional process of forming the LED's is through a growth of n-type and p-type epitaxial layers on an n-type GaP substrate by a liquid phase method. The method of liquid phase epitaxial growth is roughly classified into the temperature difference method and the gradual cooling method. The former method is superior to the latter on the point of the quality of crystallization, but the control of the temperature difference is difficult. The gradual cooling method is more favorable in view of mass production, and is applied in the production of cheap LED's. In the formation of an epitaxial layer by the gradual cooling method, if the n-type layer and p-type layer are grown from different melts by using a slide boat, mechanical damage occurs on the junction interface. This leads to a lowering in brightness. Therefore, after the n-type layer is grown from a melt containing donor impurities, acceptor impurities with a concentration higher than that of the donor impurities are added and subsequently the p-type layer is grown. Application of the so-called overcompensation method can prevent increase in brightness.

GaP pure green LED's emit light either from the n-type or p-type layer. However, the emission of pure green light occurs in the vicinity of the band gap of GaP and hence self- absorption is negligible. Therefore, light emission from the p-type layer which is nearer to the LED surface than the n-type layer can have a higher efficiency of external light emission. However, if GaP pure green LED's are formed by the usual overcompensation method, donor impurities existing in high concentrations in the p-type layer disturb the light emission. Thus, most of the GaP pure green LED's tend to be low-brightness emission LED's. Furthermore, if donor impurities in high concentrations exist in the p-type layer, emission of yellow light appears at 570 nm due to donor-accepter pair emission or donor-free hole pair emission. The hue of GaP pure green LED's is thus a tincture of yellow. If such GaP LED's are combined with yellow-green LED's to be used as displays, the contrast of hue against yellow-green is obscured.

The first objective of this invention is to realize GaP pure green LED's with high brightness and excellent hue in spite of using an epitaxial layer grown by the overcompensation method.

The second objective of this invention is to provide a method of manufacturing the above-mentioned GaP pure-green LED's.

The third objective of this invention is to provide GaP pure-green LED's with high brightness and excellent hue, which enable the use of the overcompensation method suitable for mass production.

A further objective of this invention is to realize GaP pure-green LED's with clear contrast of hue with the yellow-green LED's thereby to extend the application range of GaP LED's for displays, etc.

The structure of pure-green LED's of this invention is as follows. On an n-type GaP substrate, another GaP epitaxial layer is formed with the same conduction type as that of the substrate. A p-type GaP epitaxial layer is formed on the above GaP epitaxial layer by an overcompensation liquid phase epitaxial method.

The average donor concentration in the p-type epitaxial layer is set at a value less than or equal to $5 \times 10^{16}$ cm$^{-3}$. This structure ensures emission of pure-green light with high brightness, in which the component of yellow light emission is suppressed. Furthermore, according to the method of the invention for obtaining such pure-green LED's, the n-type GaP epitaxial layer is formed, and subsequently acceptor impurities are supplied to this melt to compensate the donor impurities by using one melt. Prior to this subsequent process, however, the ambient atmosphere of the melt is kept at a reduced pressure for a prescribed period, where the volatilization process of part of the donor impurities from the melt is undertaken. This process ensures reduction of the donor concnetration in the p-type GaP epitaxial layer to a magnitude less than or equal to $5 \times 10^{16}$ cm$^{-3}$.

The present invention will be made more apparent from the following description taken in conjunction with the accompanying drawings, in which.

Figure 1:
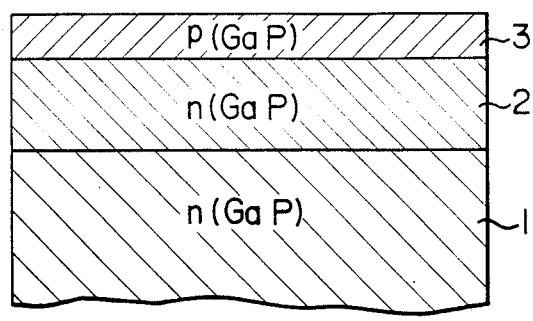
FIG. 1 is a cross-sectional view showing the structure of GaP pure-green LED's of this invention.

In FIG. 1 showing the cross-section of the structure of a GaP pure-green LED's according to one embodiment of this invention, 1 denotes an n-type GaP substrate, 2 an n-type GaP epitaxial layer grown by the gradual cooling method with use of a melt containing sulphur (S) as donor impurities, and 3 a p-type GaP epitaxial layer with average donor concentration less than or equal to $5 \times 10^{16}$ cm$^{-3}$. The latter p-type layer is grown from a melt which was used for the growth of the n-type GaP epitaxial layer and in which zinc (Zn) is added as acceptor impurities to compensate S.

Figure 2:
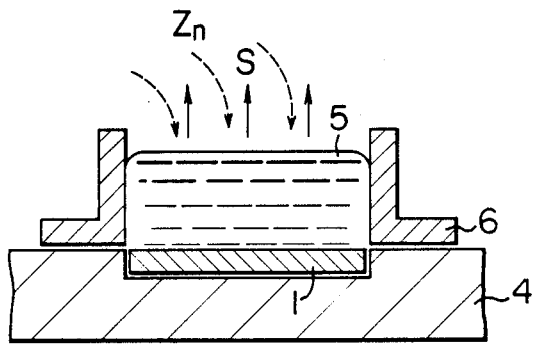
FIG. 2 is an explanatory view on the method of manufacturing the GaP pure-green LED's shown in FIG. 1 according to this invention.

FIG. 2 is a diagram showing the method for manufacturing GaP pure-green LED shown in FIG. 1. A vessel 6 of melt having a GaP melt 5 therein is disposed on a boat 4 for accomodating a GaP substrate 1 which is serving as the starting material. Thus, the GaP substrate 1 and melt 5 are made to contact with each other. This melt contains donor impurities S by $3\times10^{-5}$ mol % relative to Ga. The melt is gradually cooled from 1000° C. to 900° C. at a cooling rate of 1° C/min. to grow an n-type GaP epitaxial layer 2. Cooling is stopped at 900° C. at which the process of growing the n-type GaP epitaxial layer 2 is finished. Then, the temperature of the melt is kept at 900° C. Next, the internal ambience of the growth apparatus is maintained at a reduced pressure of 0.05 Torr. so that S in the melt is volatilized from the melt as shown by solid arrows in the figure. Thereafter, acceptor impurities Zn are supplied as vapor phase as shown by dotted arrows in the figure. The melt is then gradually cooled from 900° C. to 800° C. at a cooling rate of 1° C./min., whereby an P-type GaP epitaxial layer 3 is grown.

Figure 3:
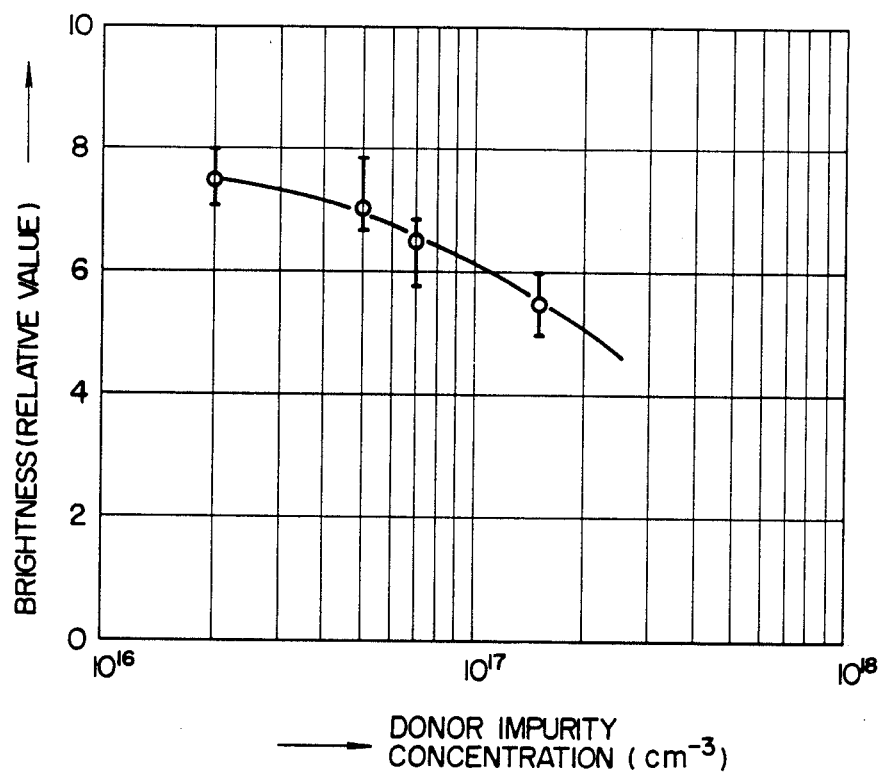
FIG. 3 is a diagram showing the relation between the brightness of GaP pure-green LED's and the average donor concentration in the p-type epitaxial layer of the above GaP LED's.

FIG. 3 shows the relation between the brightness and the average donor concentration in the p-type GaP epitaxial layer of Ga pure-green LED's formed in the above-mentioned process. As can be seen from the figure, according as the average donor concentration is decreased, the brightness increases. In the range of the average donor concentration less than or equal to $5\times10^{16}$ cm$^{-3}$, the brightness exceeds a relative value of 7 above which high brightness LED's can be realized. The average donor concentration shown in the figure decreases with increasing the setting time of the state with the reduced pressure.

When the GaP epitaxial layer was grown without introduction of this state with the reduced pressure, the conduction type did not invert to p-type. When the period of reduced pressure was longer than 3 hours, phosphor (P) was also volatilized from the melt. This causes unsaturation of the melt, and the n-type epitaxial layer already grown dissolves into the melt. Therefore, the donor concentration may not be reduced below the value indicated in the figure.

Figure 4:
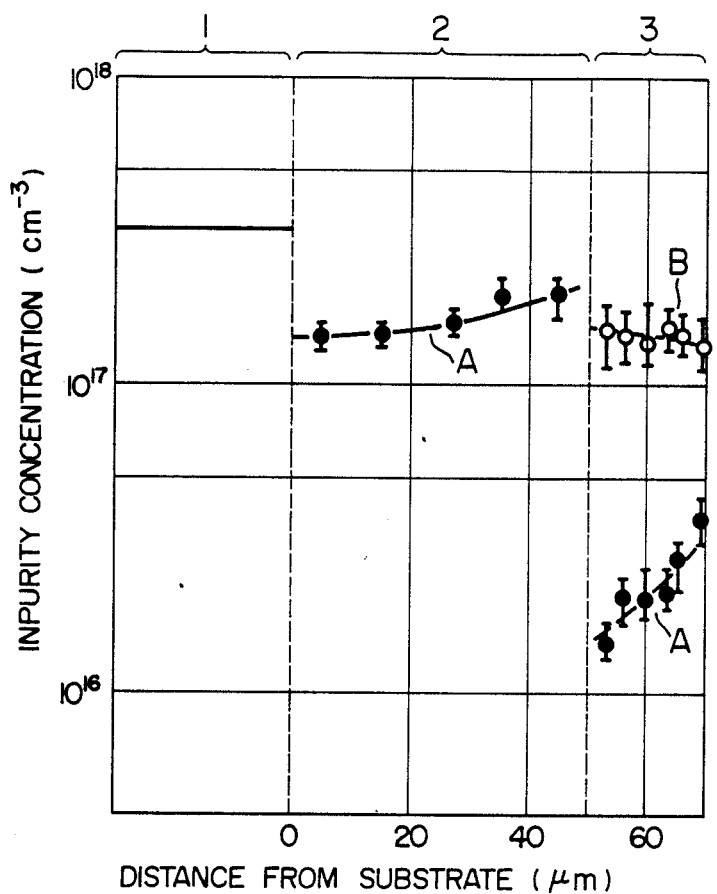
FIG. 4 is a diagram showing the donor and acceptor concentration of GaP pure-green LED's formed by undergoing the process of the reduced pressure for 3 hours in the manufactuirng processes.

FIG. 4 shows the distribution of impurity concentration in the GaP pure green LED's formed through the above-mentioned menufacturing process, where the process of reduced pressure is kept for 3 hours. Regions 1, 2 and 3 correspond to the regions 1, 2 and 3 of the structure shown in FIG. 1, respectively. A denotes the donor (impurity) concentration, while B denotes the acceptor (impurity) cocentration. The measured value of the average donor concentration in the p-type GaP epitaxial layer 3 of the GaP pure green LED's was $3\times10^{16}$ cm$^{-3}$. The average donor concentration in the p-type GaP epitaxial layer of GaP pure-green LED's formed by setting the period of reduced pressure 1 and 2 hours were $1.5\times10^{17}$ cm$^{-3}$ and $7\times10^{16}$ cm$^{-3}$, respectively.

Figure 5:
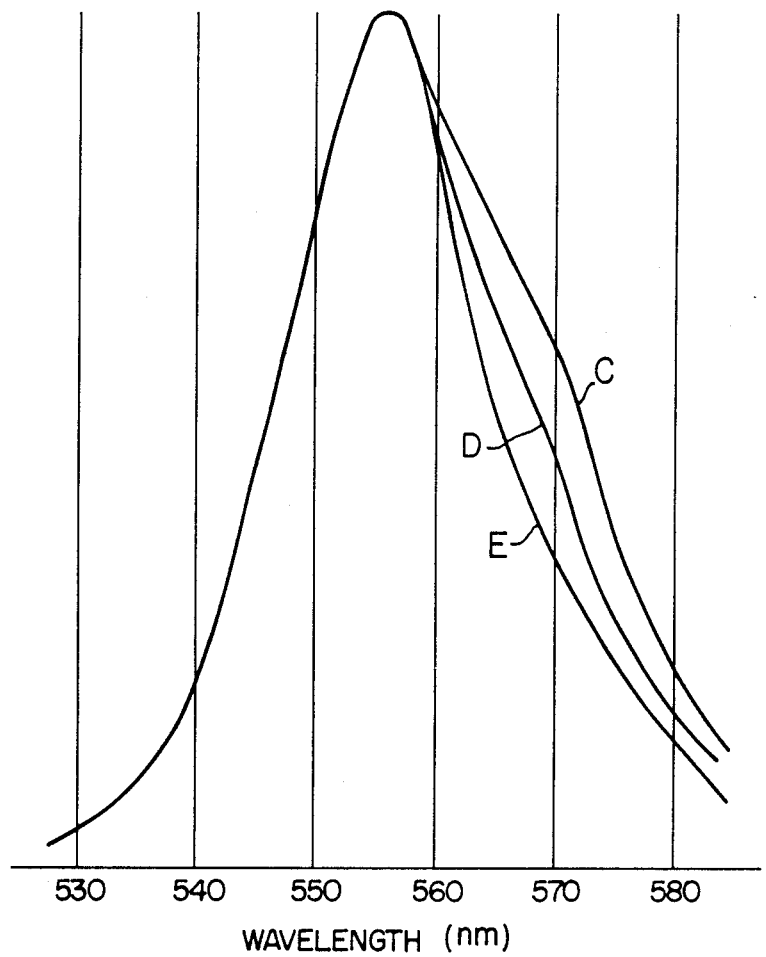
FIG. 5 is a diagram showing the dependence of the spectra of emitted light upon the period of the reduced pressure process.

FIG. 5 shows experimental data of emission spectrum dependent upon the period of reduced pressure, i.e., the variation of the spectrum of light emission of GaP pure-green LED's, when the period of reduced pressure was varied from 1 to 3 hours in the manufacturing process of GaP pure-green LED's. C, D and E correspond to the characteristics with the period of reduced pressure set as 1, 2 and 3 hours, respectively. There is seen a tendency such that the emission of yellow light near 570 nm lessens or disappears to be nonexistent as the period of reduced pressure increases. Characteristic E of GaP pure green LED's satisfying the condition of average donor concentration of less than or equal to $5\times10^{16}$ cm$^{-3}$ in p type GaP epitaxial layer with setting of the period of reduced pressure as 3 hours has little emission of yellow light near 570 nm. Therefore, emission of pure-green light showing a clear contrast with the light emitted by GaP yellow-green LED's could be obtained.

GaP pure-green LED's of this invention with such a structure as explained in conjunction with the above-described embodiment can be manufactured by the basic process of gradual cooling combining the conventional overcompensation method with addition of only one step with a reduced pressure, and hence is favorable in view of mass production. GaP pure-green LED's according to the present invention have a characteristic of emitting green light with high brightness and excellent hue easily distinguishable from yellow-green light. Since GaP pure-green LED's of this invention are suitable for mass production, cost reduction can be expected. The effect is that supply of GaP pure-green LED's can be made cheaply. Furthermore, since GaP pure-green LED's of this invention have excellent hue, they can contribute to realize three kinds of LED's emitting red, yellow-green and pure green light with high brightness from a raw GaP material. The range of application of GaP LED's to the field of displays is thus extended.

We claim:

1. A pure green light emitting diode, comprising:
   an n-type gallium phosphide substrate;
   an n-type gallium phosphide epitaxial layer, said n-type layer being formed overlying said substrate as a liquid phase epitaxial layer; and
   a p-type gallium phosphide epitaxial layer grown by a liquid phase epitaxial process on said n-type layer, said p-type layer containing donor impurities in an average donor concentration less than or equal to $5\times10^{16}$ cm$^{-3}$, such that brightness of said pure green light emitting diode attains a predetermined high brightness value with an emission peak wavelength of 555 nm.

2. A method for manufacturing a pure-green light emitting diode, comprising the steps of:
   preparing an n-type gallium phosphide substrate;
   bringing a melt for epitaxial growth containing donor impurities into contact with said substrate and decreasing a temperature of said melt at a predetermined cooling rate to cause an n-type gallium phosphide layer to grown epitaxially in liquid phase on said substrate, said donor impurities being sulfur;
   maintaining the temperature of said melt at a temperature at which growth of said n-type gallium phosphide layer becomes complete and maintaining an ambient atmosphere at a reduced pressure for a predetermined period of time thereby to volatilize donor impurities from said melt; and
   terminating maintenance of said ambient atmosphere at said reduced pressure and decreasing the temperature of said melt at a predetermined cooling rate while adding receptor impurities to said melt in vapor phase thereby to form a p-type gallium phosphide epitaxial layer having an average donor concentration of less than or equal to $5\times10^{16}$ cm$^{-3}$ on said n-type gallium phosphide layer and thereby to form a pn junction, said pure-green average donor concentration of $5\times10^{16}$ cm$^{-3}$ being selected such that brightness of said light emitting diode attains a predetermined high brightness value with an emission peak wavelength of 555 nm, said acceptor impurities being zinc.

3. A method for manufacturing a pure green light emitting diode, comprising the steps of:

preparing an n-type gallium phosphide substrate;

bringing a melt for epitaxial growth containing donor impurities into contact with said substrate and decreasing a temperature of said melt at a predetermined cooling rate to cause an n-type gallium phosphide layer to grow epitaxially in liquid phase on said substrate;

maintaining the temperature of said melt at a temperature at which growth of said n-type gallium phosphide layer becomes complete and maintaining an ambient atmosphere at a reduced pressure for a predetermined period of time thereby to volatilize donor impurities from said melt; and terminating maintenance of said ambient atmosphere at said reduced pressure and decreasing the temperature of said melt at a predetermined cooling rate while adding acceptor impurities to said melt in vapor phase thereby to form a p-type gallium phosphide epitaxial layer having an average donor concentration of less than or equal to $5 \times 10^{16}$ cm$^{-3}$ on said n-type gallium phosphide layer and thereby to form a pn junction, said average donor concentration of $5 \times 10^{16}$ cm$^{-3}$ being selected such that brightness of said light emitting diode attains a predetermined high brightness value with an emission peak wavelength of 555 nm.

4. A method for manufacturing a pure-green light emitting diode according to claim 3, wherein said predetermined period during which said ambient atmosphere is maintained at said reduced pressure is longer than or equal to 3 hours.

5. A method for manufacturing a pure-green light emitting diode according to claim 3, wherein said predetermined cooling rate of said melt is 1° C./min.

* * * * *